Aug. 25, 1959 R. R. WEBSTER 2,901,558

TRANSISTOR AMPLIFIER CIRCUITS

Filed April 5, 1955

INVENTOR

ROGER ROBINSON WEBSTER

BY Stevens, Davis, Miller and Mosher

ATTORNEYS

United States Patent Office 2,901,558

Patented Aug. 25, 1959

2,901,558

TRANSISTOR AMPLIFIER CIRCUITS

Roger Robinson Webster, Dallas, Tex., assignor to Texas Instruments Incorporated, Dallas, Tex., a corporation of Delaware Application April 5, 1955, Serial No. 499,369

1 Claim. (Cl. 179—171)

Figure 1:
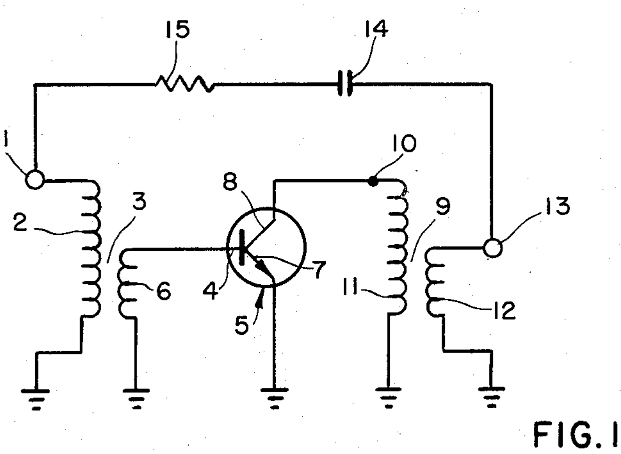

This invention relates to semiconductor amplifier circuits and more particularly to a method of neutralizing the effects of interelectrode capacitance in semiconductor amplifier devices.

In the use of semiconductor crystal amplifier devices, generally referred to as transistors and now well-known in the electronics art, certain circuitry problems are encountered which are very similar to some of the circuitry problems arising in the use of triode vacuum-tube power amplifiers. One of these problems arises from the undesirable effects of interelectrode capacitance inherent in both the vacuum-tube triodes and transistor triodes. In triode amplifiers, especially those operating as power amplifiers in the radio-frequency range, the interelectrode capacitance may allow sufficient direct transfer of signal energy between the input and output electrodes of the amplifier device to produce feedback of such magnitude that, if positive or regenerative, uncontrolled oscillations result in the circuit or, if negative or degenerative, the gain of the circuit is substantially reduced.

One method used to counteract the effects of interelectrode capacitance in vacuum-tubes is to introduce, by means of a circuit external to the amplifier device, signal energy which is equal in magnitude but opposite in phase to the energy transferred between the electrodes through the interelectrode capacitance. The same method of neutralization by reverse phase feedback has been applied to transistor amplifier circuits. One such neutralization circuit presently used with transistor amplifiers employs a series capacitor-resistor network connected between the output electrode of the amplifier device and the primary coil of the input transformer to the amplifier stage. In this prior art system, in order for the neutralizing feedback energy to cancel the effects of the feedback energy transferred directly between electrodes of the amplifier device, the neutralization circuit must feed back a voltage to the primary coil of the transformer which will, when induced into the secondary coil of the transformer, appear as a voltage equal in magnitude but opposite in phase to the feedback voltage through the interelectrode capacitance. Therefore, the voltage transformation ratio of the transformer and the inherent series resistance of the input electrode as well as the value of interelectrode capacitance of the amplifier device must all be taken into account when determining the proper component values for the neutralization circuit. For instance, if the voltage transformation ratio of the input transformer is designated as "*a*," i.e., $V_p/V_s=a$, the neutralizing voltage fed back to the primary of the transformer must be "*a*" times the voltage to be neutralized in the circuit of the secondary coil of the transformer. This requires that the reactance of the neutralizing capacitor be "*a*" times the interelectrode capacitance reactance. Since capacitance is inversely proportional to its reactance, the neutralizing capacitance must be equal to the interelectrode capacitance divided by "*a*."

Another factor is that, although by proper connection of the transformer the phase of the feedback voltage through the transformer may be made opposite to the feedback voltage through the interelectrode capacitance, the phase shift due to the inherent resistance of the input electrode must be considered. Thus, a resistor of the value "*a*" times the input electrode series resistance must appear in the neutralization circuit to produce a neutralizing voltage exactly 180° out of phase with the voltage to be neutralized at the point in the circuit where that voltage is to be neutralized, that is, the input electrode lead of the amplifier device. Since the interelectrode capacitance is usually in the range of from ten to one hundred micromicrofarads, it can easily be seen that with a transformer in which the voltage transformation ratio is from five to twenty, an extremely small capacitor and a large resistor must be used in series in the neutralization circuit to achieve the desired effect. Although the small capacitor would seem to be an advantage, it often turns out to be most difficult to control the minute amounts of power required in such a feedback circuit because the small stray capacitances which may be present between the leads and the chassis or ground have a relatively large effect.

For the reasons indicated above, it is quite often desirable to use a larger capacitor in the negative feedback circuit. A larger capacitor may be used if the feedback network is connected between the secondary coil of the output transformer of the stage and the input electrode of the amplifier device. When using this arrangement, the neutralization capacitance will be "*a*" times the interelectrode capacitance and the value of its series resistor will be the input electrode resistance divided by "*a*." Thus, the size of the neutralizing capacitor is increased and the feedback power level is such that control is much easier. However, this circuit very often causes excessive loading in the output circuit of the amplifier and the large size and higher cost of the feedback capacitor make this circuit undesirable.

In the neutralization circuit of the present invention, the feedback network is connected between a secondary coil of the output transformer of the amplifier circuit and the primary coil of the input transformer of the amplifier circuit. Such a neutralization circuit requires less power and a smaller capacitor than the circuit last described above and yet the power level is such that the feedback signal may be easily controlled.

It is one object, therefore, of the present invention to provide a means of neutralizing the effects of interelectrode capacitance in transistor amplifier devices in which the power utilized for neutralization is not so large that the output circuit of the amplifier circuit is excessively loaded but still not so small that its control is difficult.

It is another object of the present invention to provide a means for neutralizing the effects of interelectrode capacitance in transistor amplifier devices in which the capacitive element of the neutralization circuit is sufficiently large that the effects of stray capacitance in the amplifier circuit will be negligible and yet sufficiently small that its size and cost are not excessive.

Figure 2:
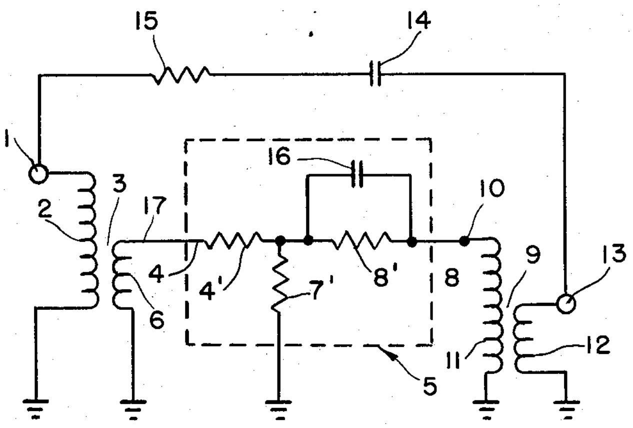

Other objects and advantages of the neutralization circuit of the present invention will become apparent from the following detailed description in which reference is made to the accompanying drawing wherein:

Figure 1 is a schematic diagram of a typical transistor amplifier circuit incorporating the neutralization circuit of the present invention; and Figure 2 is a schematic diagram of the circuit of Figure 1 with the equivalent circuit of the transistor amplifier device substituted therefor.

With reference now to Figure 1, there is shown a typical transistor amplifier circuit together with the neutralization circuit of the present invention wherein the D.-C. bias connections and components have been omitted for the sake of clarity. In the illustrated circuit, the signal voltage from the preceding amplifier stage is fed to the terminal 1 of the primary coil 2 of the input transformer 3 and coupled to the input electrode 4 of the transistor amplifier device 5 through the connection of the electrode 4 to the secondary coil 6 of the coupling transformer 3. Because of the relatively low input impedance and high output impedance of transistor amplifiers, the coupling transformers generally used are of the voltage step-down type. The electrode of the amplifier device common to both the input and output circuit is designated as 7 and is grounded. The output electrode 8 is connected to the output circut coupling transformer 9 at terminal 10 of the primary coil 11. The amplified signal output to the next amplifier stage is taken from the coupling transformer secondary coil 12 at the terminal 13. The neutralization network comprised of the neutralizing condenser 14 and resistor 15 is connected between terminal 13 of the output transformer secondary coil 12 and terminal 1 of the input transformer primary coil 2.

Turning now to Figure 2, the circuit of Figure 1 is again illustrated but with the equivalent circuit of the amplifier device substituted therefor to show the inherent resistances 4′, 7′, and 8′ of the three electrodes 4, 7, and 8 respectively and interelectrode capacitances 16. The remaining components of Figure 2 are designated by the same reference numbers by which they are identified in Figure 1. In Figure 2, the feedback path of the energy producing the undesirable effects in the amplifier circuit is from the output electrode 8 through the interelectrode capacitance 16 and the input electrode resistance 4′ to the input electrode lead 17. The output electrode resistance 8′ can be ignored when considering this feedback circuit because its resistance is high compared to the interelectrode capacitive reactance and its effect in the parallel connection with the capacitance 16 is insignificant.

The neutralization energy feedback path in Figure 2 is from the output electrode 8 of the amplifier device through the output transformer 9, the neutralizing condenser 14 and resistor 15 and the input transformer 3 to the input electrode 4. The impedance of this neutralization circuit must be such that it produces an apparent neutralizing voltage feedback between the output and input electrodes 8 and 4, of the amplifier device 5 equal and opposite to the feedback voltage produced through the amplifier device. To achieve this feedback voltage, the impedance of the neutralization circuit must produce in the feedback voltage the same phase angle as does the interelectrode feedback impedance plus 180°. The transformers are connected so that one, and it makes no difference which one, produces the desired 180° phase shift. Thus, it is only necessary that the ratio of the reactance of the neutralizing capacitance 14 to the resistance of the neutralizing resistor 15 be the same as the ratio of the reactance of the interelectrode capacitance 16 to the input electrode resistance 4′ ($X_n/R_n=X_f/R_f$). Thus, if the voltage transformation ratio of the input and output transformers 3 and 9 are $a_1$ and $a_2$ respectively, the correct value for the neutralizing circuit impedance will be $a_2$ times the interelectrode feedback impedance of the amplifier device divided by $a_1$ ($Z_n=a_2Z_f/a_1$). Since the neutralizing voltage phase angle must be the same as the neutralized voltage phase angle, the resistance of the neutralization circuit must equal $a_2$ times the input electrode resistance 4′ divided by $a_1$ ($R_n=a_2R_f/a_1$), and the neutralizing circuit capacitive reactance must equal $a_2$ times the interelectrode capacitive reactance divided by $a_1$ ($X_n=a_2X_f/a_1$), or the neutralizing capacitance 14 must equal $a_1$ times the interelectrode capacitance 16 divided by $a_2$ ($C_n=a_1C_f/a_2$). When the component values of the neutralization circuit of the present invention are in the ratios to the internal impedance of the amplifier device indicated above, the desired neutralization is produced.

In summary, the internal feedback impedance between the collector and base electrodes of the transistor 5 is a function of both the junction capacity and the resistance of the semiconductive material. Since the resistance of the semiconductive material has an appreciable effect upon the phase angle of the internal impedance, the impedance of the external feedback circuit must also include a resistive element of the proper magnitude to match the phase angle of the external impedance to that of the internal impedance. In consequence, the values of the capacitor 14 and resistor 15 must be such that the magnitude of the external feedback voltage is equal to the magnitude of the internal feedback voltage and the relative values of these elements must provide a proper phase angle. In order to permit the value of the capacitor 14 to meet the above requirements, and further, to lie in a practical range of values, the transformers 3 and 9 are employed. The connection of the transformers 3 and 9 in the external feedback circuit multiplies the external feedback impedance by the factor $$\frac{a_2}{a_1}$$

and, therefore, by adjusting the relative transformation ratios of these two transformers, the values of the capacitor 14 and resistor 15 may be chosen to lie in a practical range of values.

Thus, there has been described a neutralization circuit for transistor amplifiers in which the power required to neutralize the amplifier is not so great that it loads the output circuit excessively nor is it so small that it is difficult to control, and in which the size of the neutralizing capacitor is not so large as to be cumbersome and incompatible with the other components of the usual miniaturized transistor circuit nor so small that stray capacity of the amplifier circuit produces noticeable effects.

Although the neutralization circuit of the present invention has been illustrated in connection with a transistor amplifier wherein the emitter is the electrode common to both the input and output circuits, it is equally applicable to other types of transistor amplifier circuits. Many changes, alterations, and substitutions in the neutralization circuit of the present invention will be apparent to those skilled in the art, and therefore, the present invention is to be limited only as set forth in the appended claim.

What is claimed:

An electrical circuit including a transistor having an inherent shunted interelectrode capacitance and an inherent input interelectrode resistance, a step-down input transformer having primary and secondary windings, an output transformer having primary and secondary windings, one of said transformers producing a 180° output phase shift, said input transformer being attached to an effective terminal of said interelectrode resistance and said output transformer being connected to an effective terminal of the shunt circuit of said interelectrode capacitance, and means for neutralizing the interelectrode capacitance and resistance of said transistor comprising a circuit from the primary winding of said input transformer to the secondary winding of said output transformer consisting of a resistor and a capacitor, said resistor and capacitor having a combined impedance to exactly match the combined impedance of the inherent input interelectrode resistance and the inherent shunted interelectrode capacitance of said transistor after transformation.

References Cited in the file of this patent

UNITED STATES PATENTS

| | | |
|---|---|---|
| 1,721,146 | De Land | July 16, 1929 |
| 1,762,945 | Anderson | June 10, 1930 |
| 1,814,247 | Fearing | July 14, 1931 |
| 1,833,638 | Drake et al. | Nov. 24, 1931 |

(Other references on following page)

UNITED STATES PATENTS

| | | |
|---|---|---|
| 1,930,672 | Ballantine | Oct. 17, 1933 |
| 2,099,442 | Howell | Nov. 16, 1937 |
| 2,231,372 | Rothe et al. | Feb. 11, 1941 |
| 2,662,124 | McMillan | Dec. 8, 1953 |

OTHER REFERENCES

Barton, abstract of application Serial number 78, 268, published October 28, 1952. O. G., vol. 663, page 1220-1, Class 179—subclass 171.

"Principles of Transistor Circuits," edited by Richard F. Shea, published John Wiley & Sons, Inc., September 1953, particularly Figures 6, 17.